(12) United States Patent
Yao et al.

(10) Patent No.: US 8,274,092 B2
(45) Date of Patent: *Sep. 25, 2012

(54) LIGHT-EMITTING DEVICE HAVING A ROUGHENED SURFACE WITH DIFFERENT TOPOGRAPHIES

(75) Inventors: Chiu-Lin Yao, Hsinchu (TW); To-Cheng Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 35 days.

This patent is subject to a terminal disclaimer.

(21) Appl. No.: 12/905,795

(22) Filed: Oct. 15, 2010

(65) Prior Publication Data
US 2011/0024789 A1  Feb. 3, 2011

Related U.S. Application Data

(63) Continuation of application No. 12/230,054, filed on Aug. 22, 2008, now Pat. No. 7,834,369.

(30) Foreign Application Priority Data

Aug. 23, 2007  (TW) ................................ 96131320 A (51) Int. Cl.
*H01L 33/22* (2010.01)

(52) U.S. Cl. ...................... 257/95; 257/99; 257/E33.074
(58) Field of Classification Search ............ 257/E33.074
See application file for complete search history.

(56) References Cited

U.S. PATENT DOCUMENTS

| 6,791,117 | B2 * | 9/2004 | Yoshitake et al. | ............... 257/94 |
| 7,834,369 | B2 * | 11/2010 | Yao et al. | ........................ 257/95 |
| 2006/0204865 | A1 * | 9/2006 | Erchak et al. | ..................... 430/7 |

* cited by examiner

*Primary Examiner* — Stephen W Smoot
(74) *Attorney, Agent, or Firm* — Patterson & Sheridan, LLP (57) ABSTRACT

This invention provides an optoelectronic semiconductor device having a rough surface and the manufacturing method thereof. The optoelectronic semiconductor device comprises a semiconductor stack having a rough surface and an electrode layer overlaying the semiconductor stack. The rough surface comprises a first region having a first topography and a second region having a second topography. The method comprises the steps of forming a semiconductor stack on a substrate, forming an electrode layer on the semiconductor stack, thermal treating the semiconductor stack, and wet etching the surface of the semiconductor stack to form a rough surface.

10 Claims, 10 Drawing Sheets

FIG. 1

PRIOR ART

FIG. 6

LIGHT-EMITTING DEVICE HAVING A ROUGHENED SURFACE WITH DIFFERENT TOPOGRAPHIES

CROSS-REFERENCE TO OTHER APPLICATIONS

This application is a continuation of U.S. patent application Ser. No. 12/230,054, now U.S. Pat. No. 7,834,369, entitled "Light-Emitting Device Having a Roughened Surface With Different Topographies", filed Aug. 22, 2008, which claims the right of priority based on Taiwan Application Serial Number 096131320, filed Aug. 23, 2007, which are herein incorporated by references.

TECHNICAL FIELD

This invention relates to a semiconductor optoelectronic device having a rough surface and the manufacturing method thereof.

BACKGROUND OF THE DISCLOSURE

Figure 1:
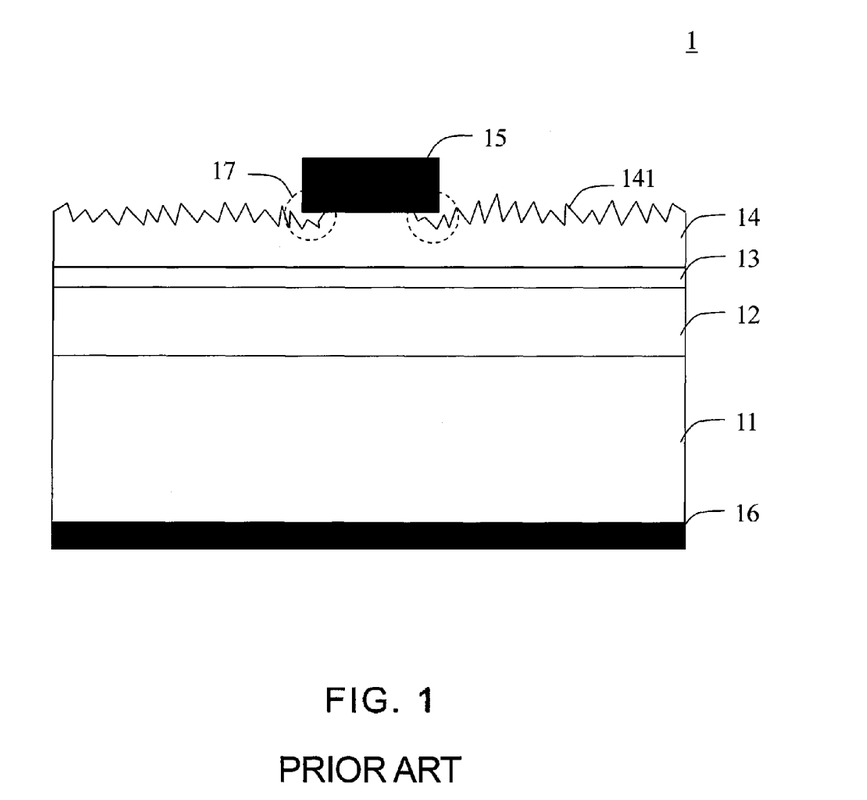
FIG. 1 is a schematic diagram showing a light-emitting device according to a conventional structure.

Surface roughening is one of the efficient ways to improve light extraction efficiency of a light-emitting device. Roughening the substrate or the upmost semiconductor layer into irregular protrusionsl depressions to scatter incident light impinging on the roughened surface is an example to improve light extraction efficiency. Roughening surface can be achieved by known processes like mechanically polishing or reactive-ion-etching (RIE). Another feasible way is performed by wet etching the wafer immersed in an etching solution for certain duration. The surface is roughened by different etching rates of the etching solution versus different exposed crystal planes of the surface. The roughened surface of the light-emitting device, as shown in FIG. 1, is formed by wet etching. The light-emitting device comprises a growth substrate 11, an n-type semiconductor layer 12, an active layer 13, a p-type semiconductor 14, a p-side conductive pad, and an n-side conductive pad. The surface of the p-type semiconductor layer 14 is wet-etched to form a roughened surface. An undercut 17 is formed due to lateral etching in the border between the p-side conductive pad 16 and the p-type semiconductor layer 14. The contact area between the p-side conductive pad 16 and the p-type semiconductor layer 14 is therefore reduced such that the device reliability is easily failed or the p-side conductive pad 16 is easily peeled off by the stress. Besides, the uniformity of the roughened surface formed by the conventional wet etching method is not good enough to keep the product stable.

Another conventional way to prevent the light-emitting device from reliability failure or pad peeling is to form the roughened surface before forming the conductive pad, but the contact resistance between the conductive pad and the roughened surface of the underlying layer becomes high and therefore downgrade the device performance. Besides, the resulted surface of the conductive pad is uneven and therefore obstructs the wire-bonding yield.

SUMMARY OF THE DISCLOSURE

One aspect of the present invention is to provide an optoelectronic semiconductor device comprising a substrate; a semiconductor stack further comprising a first semiconductor layer of a first conductivity, an active layer, and a second semiconductor layer of a second conductivity; and an electrode layer formed on the second semiconductor layer; wherein the first and/or second semiconductor layer having a rough surface comprising a first region having a first topography and a second region having a second topography.

Another aspect of the present invention is to provide a method for forming a rough surface on a semiconductor layer of an optoelectronic semiconductor device. The method comprises the steps of forming a semiconductor stack on a substrate; forming an electrode layer on the semiconductor stack; heat treating the semiconductor stack and the electrode layer; and wet etching the surface of the semiconductor stack to form a rough surface.

The optoelectronic semiconductor device comprises light-emitting device or photovoltaic device.

DETAILED DESCRIPTION OF THE PREFERRED EMBODIMENTS

Figure 2A:
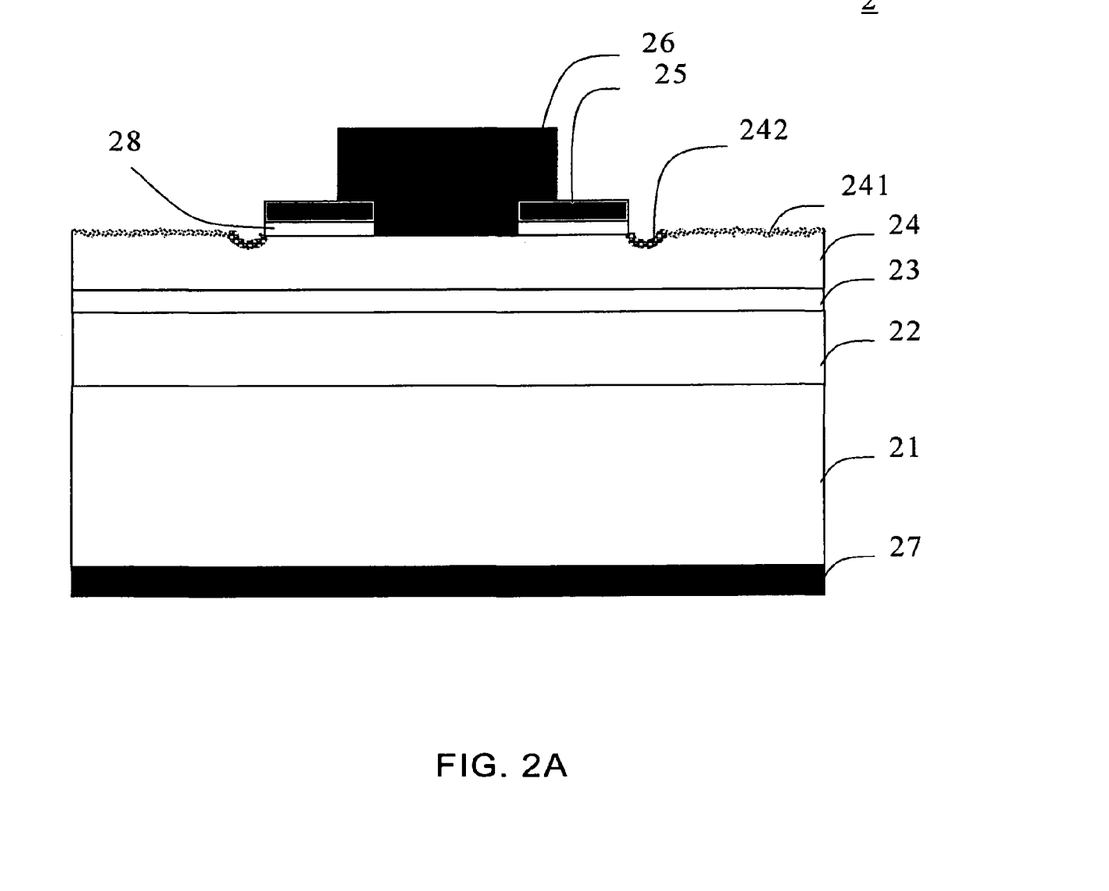
FIG. 2A to FIG. 2B are schematic diagrams showing one embodiment of a light-emitting device in accordance with the present invention.
Figure 2B:
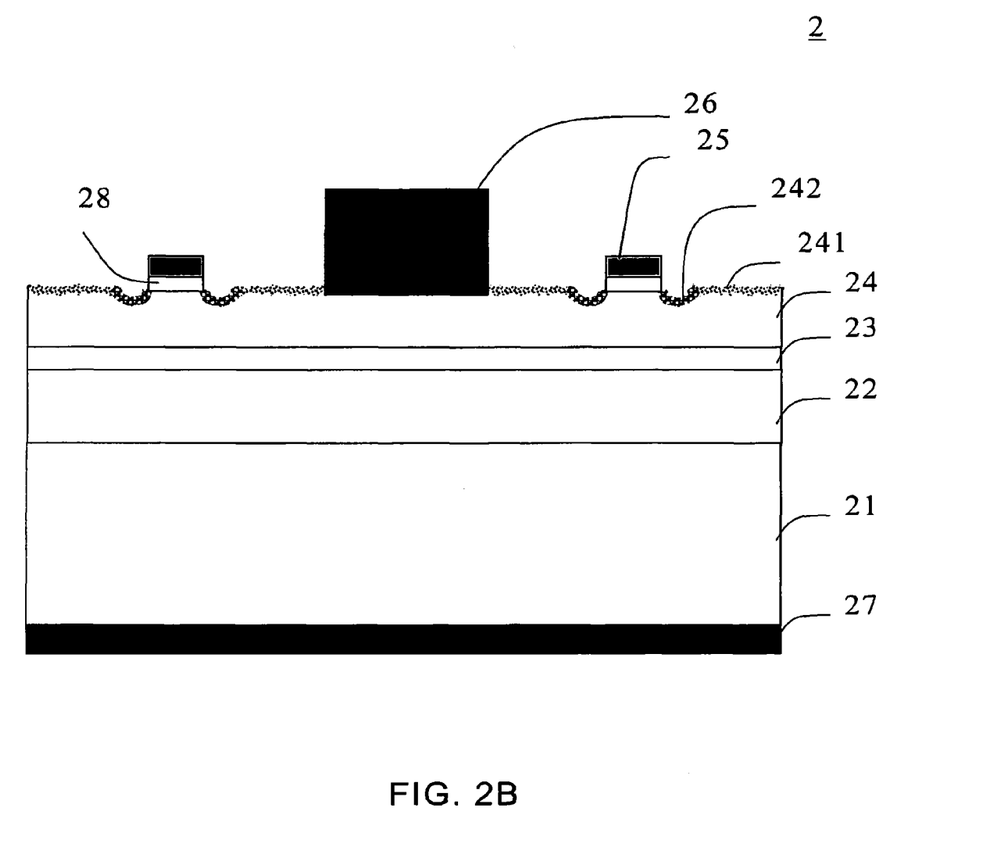
Figure 2C:
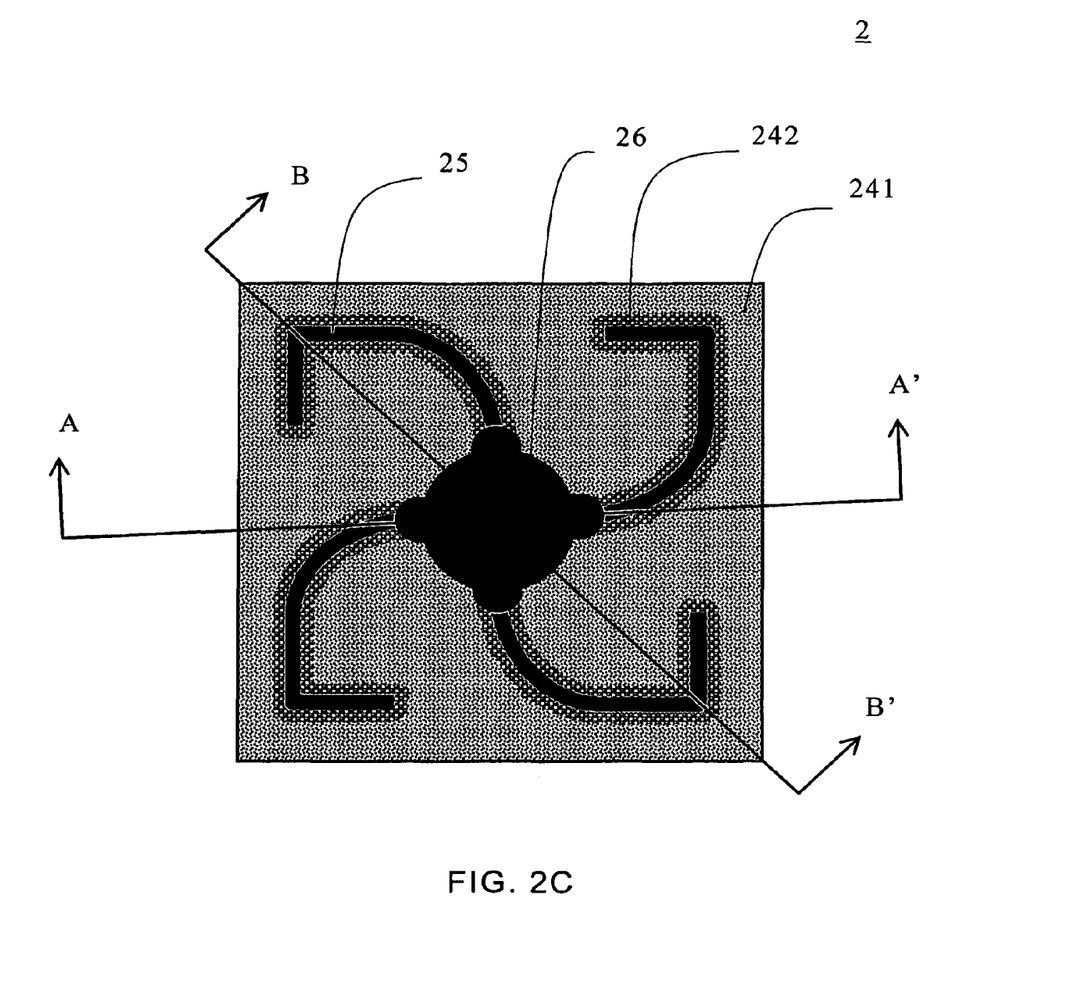
FIG. 2C is a schematic diagram showing the top view of the light-emitting device in FIG. 2A or FIG. 2B.

FIG. 2A to FIG. 2C show a light-emitting device 2 in accordance with the present invention. FIG. 2C is a top view of the light-emitting device 2, and FIG. 2A and FIG. 2B are the cross-section views along with AA' and BB' respectively. As shown in FIG. 2A and FIG. 2B, the light-emitting device 2 comprises a substrate 21 having a top surface and a bottom surface; a first semiconductor layer 22 of a first conductivity overlaying the substrate; an active layer 23 overlaying the first semiconductor layer 22; a second semiconductor layer 24 of a second conductivity comprising a rough surface overlaying the active layer 23; an extended electrode layer 25 overlaying the second semiconductor layer 24; a first conductive pad 26 overlaying a portion of the extended electrode layer 25 and a portion of the second semiconductor layer 24; and a second conductive pad 27 underlying the bottom surface of the substrate 21. The material of the first semiconductor layer 22, the active layer 23, or the second semiconductor layer 24 comprises n-type or p-type $Al_pGa_qIn_{(1-p-q)}P$ or $Al_xIn_yGa_{(1-x-y)}N$ ($0 \sim p, q, x, y \sim 1$; $(p+q) \sim 1$; $(x+y) \sim 1$). The first semiconductor layer 22 comprises a first conductivity type cladding layer, and the second semiconductor layer 24 comprises a second conductivity type cladding layer. The extended electrode layer 25 is a current spreading layer having a pattern extended toward the surroundings of the light-emitting device for spreading current as shown in FIG. 2C. The first conductive pad 26 is a bonding pad covering and electrically coupled to a portion of the extended electrode layer 25. The material of the extended electrode layer 25 comprises single or multilayer of metal or metal alloy such as GelAu. The material of the conductive pad 26 comprises multilayer of metal such as Cr/Au. In one embodiment, the light-emitting device 2 further comprises an ohmic contact layer 28 interposed between the second semiconductor layer 24 and the extended electrode layer 25. The ohmic contact layer 28 comprises a semiconductor layer with a higher doping concentration than that of the second semiconductor layer 24, such as GaAs having Si-doping concentration higher than $10^{18cm-3}$. The conductivity type of the ohmic contact layer 28 can be the same as or different to the second semiconductor layer 24 and form an ohmic contact with the second semiconductor layer 24. In a preferred embodiment, the ohmic contact layer 28 is formed only under the region covered by the extended electrode layer 25. The first conductivity type comprises n-type or p-type, and the second conductivity type is different from the first conductivity type.

Figure 3A:
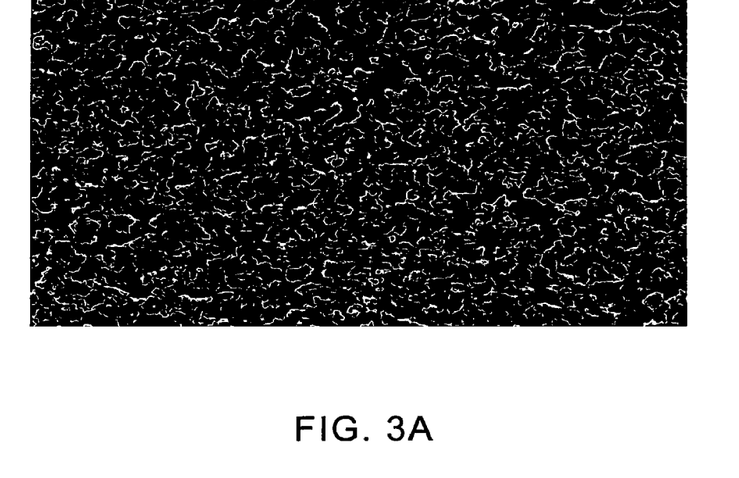
FIG. 3A is an SEM picture showing the first topography of the rough surface formed in accordance with the present invention.
Figure 3B:
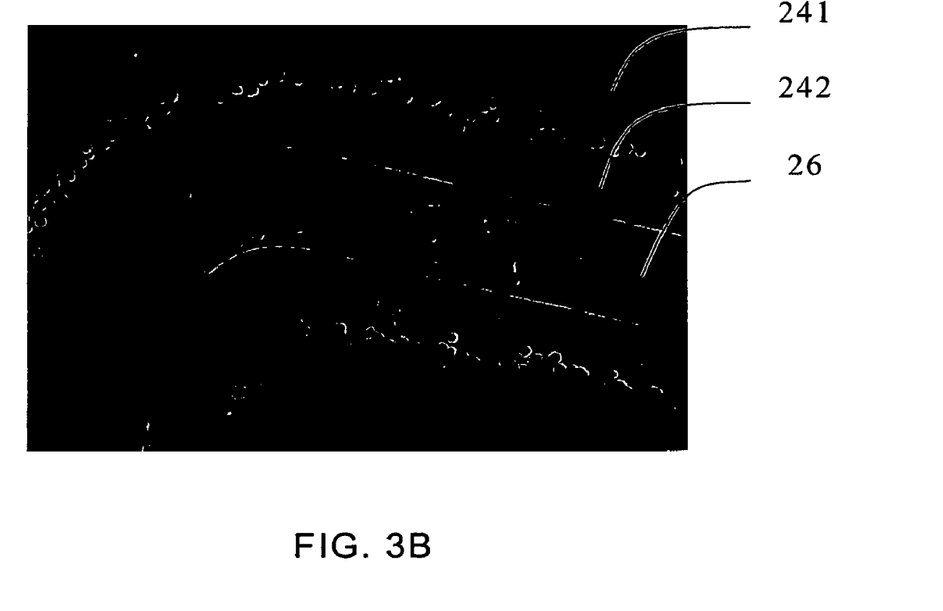
FIG. 3B is an SEM picture showing the second topography of the rough surface formed in accordance with the present invention.

The rough surface comprises a first region 241 having a first rough topography and a second region 242 having a second rough topography. The first region and the second region comprise a plurality of depressions and protrusions. The dimension of the first rough topography is smaller than that of the second rough topography. In an embodiment of the present invention, the distance between the neighboring depressions or the distance between the neighboring protrusions of the first rough topography is around 0.1 to 0.5 micron. The depth of at least one of the depressions or the height of at least one protrusion of the first rough topography is around 0.1 to 0.5 micron. The distance between the neighboring depressions or the distance between the neighboring protrusions of the second rough topography is around 1 to 10 microns. The depth of at least one of the depressions or the height of at least one of the protrusions of the second rough topography is around 0.5 to 2 microns. The first rough topography as shown in FIG. 3A is a randomly rough surface having a plurality of depressions and protrusions. The second rough topography as shown in FIG. 3B is a wave-shape surface. The second region 242 having the second topography is adjacent to and surrounds the extended electrode layer 25, and therefore separating the extended electrode layer 25 from the first region 241 having the first rough topography. The level, i.e, the average altitude of the surface, of the second region 242 is about 0.5 to 2 microns lower than that of the first region 241. The cross-sectional shape of the second region 242 is a curve such that the interface between the extended electrode layer 25 and the second region 242 is outward oblique from the extended electrode layer 25 to prevent from undercut and further improve the reliability of the device and the peeling-off issue of the electrode layer.

Figure 4:
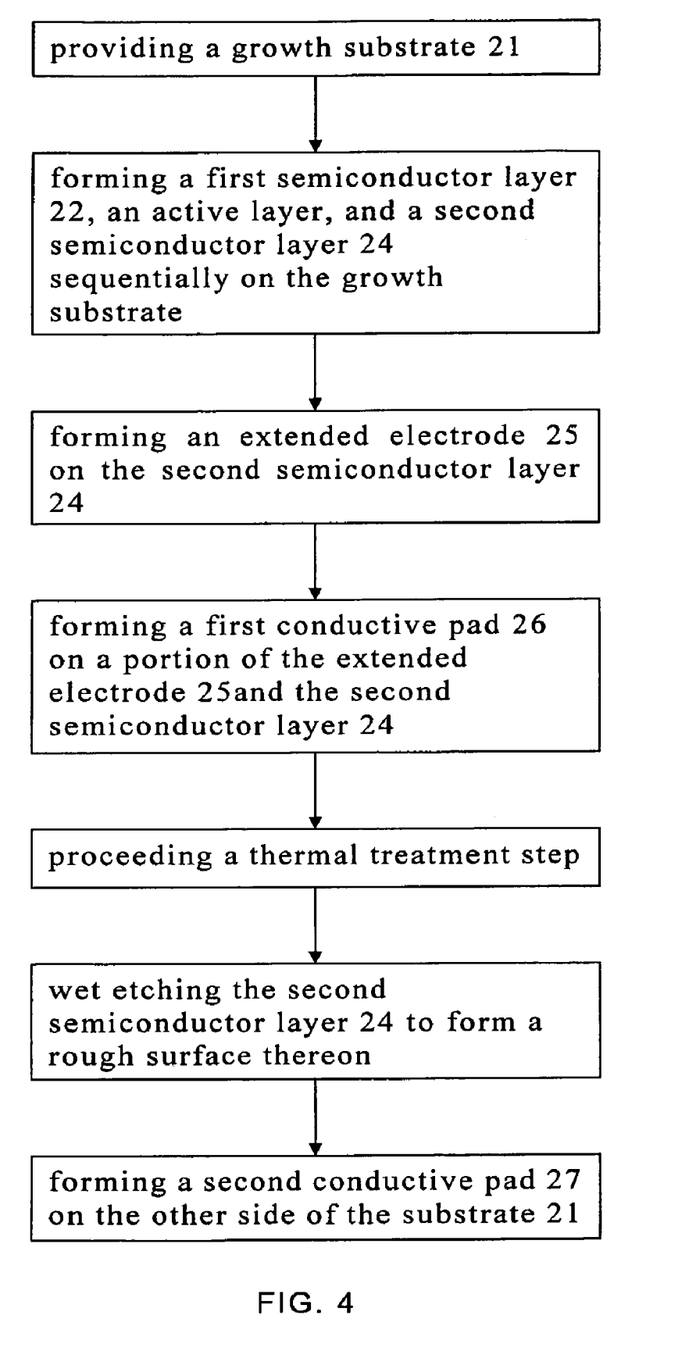
FIG. 4 is a flow chart showing the manufacturing method in accordance with the present invention.

FIG. 4 discloses a manufacturing method for forming the above-mentioned light-emitting diode 2. The method comprises the steps of:
1 providing a growth substrate 21;
2 forming a first semiconductor layer 22, an active layer, and a second semiconductor layer 24 sequentially on the growth substrate;
3 forming an extended electrode layer 25 on the second semiconductor layer 24; proceeding a thermal treatment step, such as rapid thermal annealing (RTA);
4 forming a first conductive pad 26 on a portion of the extended electrode layer 25 and the second semiconductor layer 24;
5 proceeding a thermal treatment step, such as rapid thermal annealing (RTA);
6 wet etching the second semiconductor layer 24 by an etching solution comprising HF, HN03, CH3COOH, and iodine under a low temperature condition from room temperature to 60° C. to form a rough surface thereon, wherein the features of the rough surface is described in the previous embodiments, such as FIG. 3A and FIG. 3B;
7 forming a second conductive pad 27 on the other side of the substrate 21.

The structure formed by the method is shown in FIG. 2A or FIG. 2B.

Figure 5A:
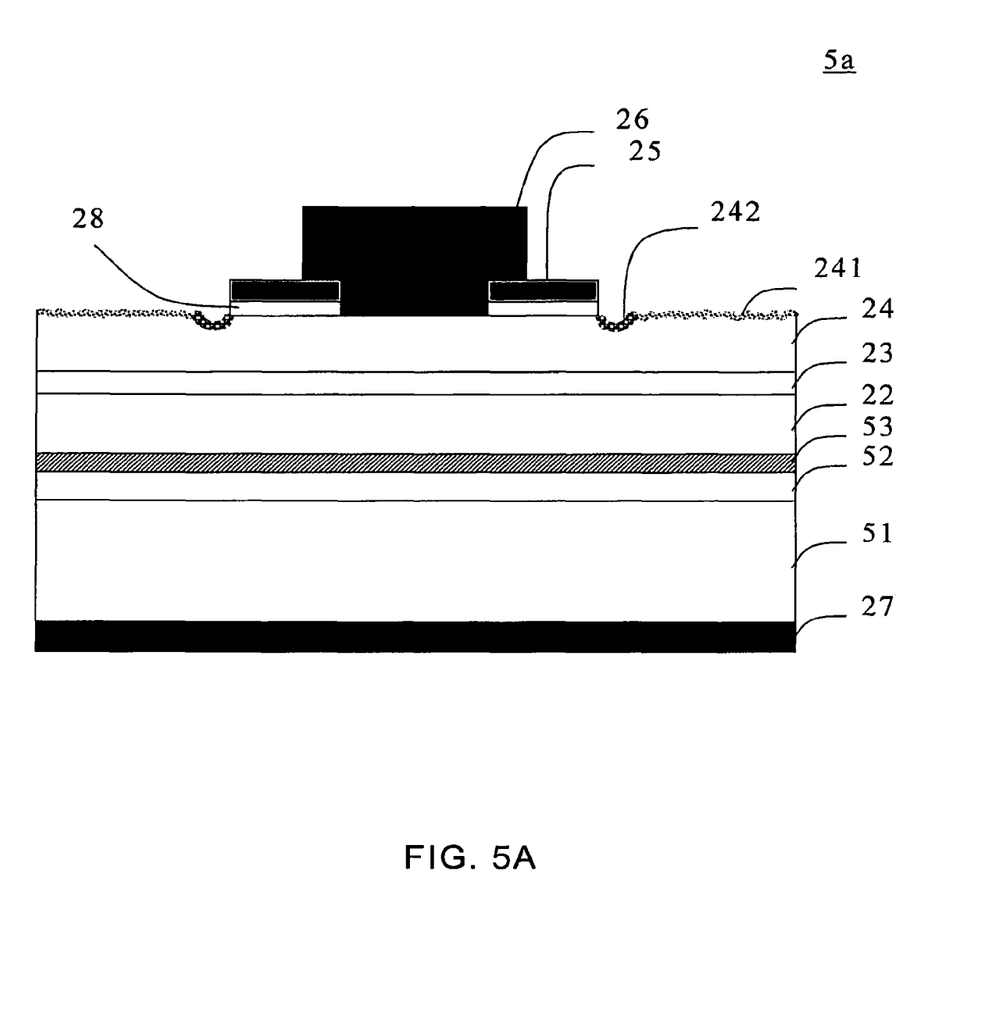
FIG. 5A to FIG. 5C are schematic diagrams showing a light-emitting device comprising a bonding structure in accordance with the present invention.

FIG. 5A shows another embodiment of the present invention. The light-emi device 5a as shown in FIG. 5A is similar to the light-emitting device 2. The distinction is that the substrate 51 of the light-emitting device 5a is a conductive substrate. The substrate 51 can also be a transparent or opaque conductive substrate. It is also preferred that the substrate is a conductive substrate comprising a material having high thermal conductivity not lower than 100 W/crn.oC, such as Si, Cu, or diamond. The conductive substrate 51 is coupled to the first semiconductor layer 22 by a conductive connecting layer 52. The conductive connecting layer 52 comprises a transparent conductive layer or a conductive adhesive layer. The material of the transparent conductive layer comprises transparent conductive oxide, such as indium tin oxide (ITO), zinc oxide (ZnO), or thin metal. The material of the conductive adhesive layer comprises silver paste or solder metal. The light-emitting device 5a further comprises a reflecting layer 53 formed between the conductive connecting layer 52 and the first semiconductor layer 22 for reflecting the light emitted from the active layer 23 and preventing from being absorbed by the conductive substrate 51 if the conductive substrate 51 is opaque.

The manufacturing method for forming the light-emitting device 5a comprises the steps of:
1 providing a growth substrate (not shown);
2 forming a first semiconductor layer 22, an active layer 23, and a second semiconductor layer 24 sequentially on the growth substrate;
3 bonding a temporary substrate (not shown) to the second semiconductor layer 24;
4 removing the growth substrate to expose one surface of the first semiconductor layer 22;
5 forming a reflecting layer 53 on the exposed surface of the first semiconductor layer 22;
6 forming a conductive connecting layer 52 on a conductive substrate 51;
7 bonding the conductive substrate 51 with the conductive connecting layer 52 to the reflecting layer 53;
8 removing the temporary substrate to expose one surface of the second semiconductor layer 24
9 forming an extended electrode layer 25 on the exposed surface of the second semiconductor layer 24;
10 forming a first conductive pad 26 on a portion of the extended electrode layer 25 and the second semiconductor layer 24;
11 proceeding a thermal treatment step, such as rapid thermal annealing (RTA);
12 wet etching the second semiconductor layer 24 to form a rough surface thereon, wherein the features of the rough surface is described in the previous embodiments, such as FIG. 3A and FIG. 3B;
13 forming a second conductive pad 27 on the other side of the conductive substrate 51.

Figure 5B:
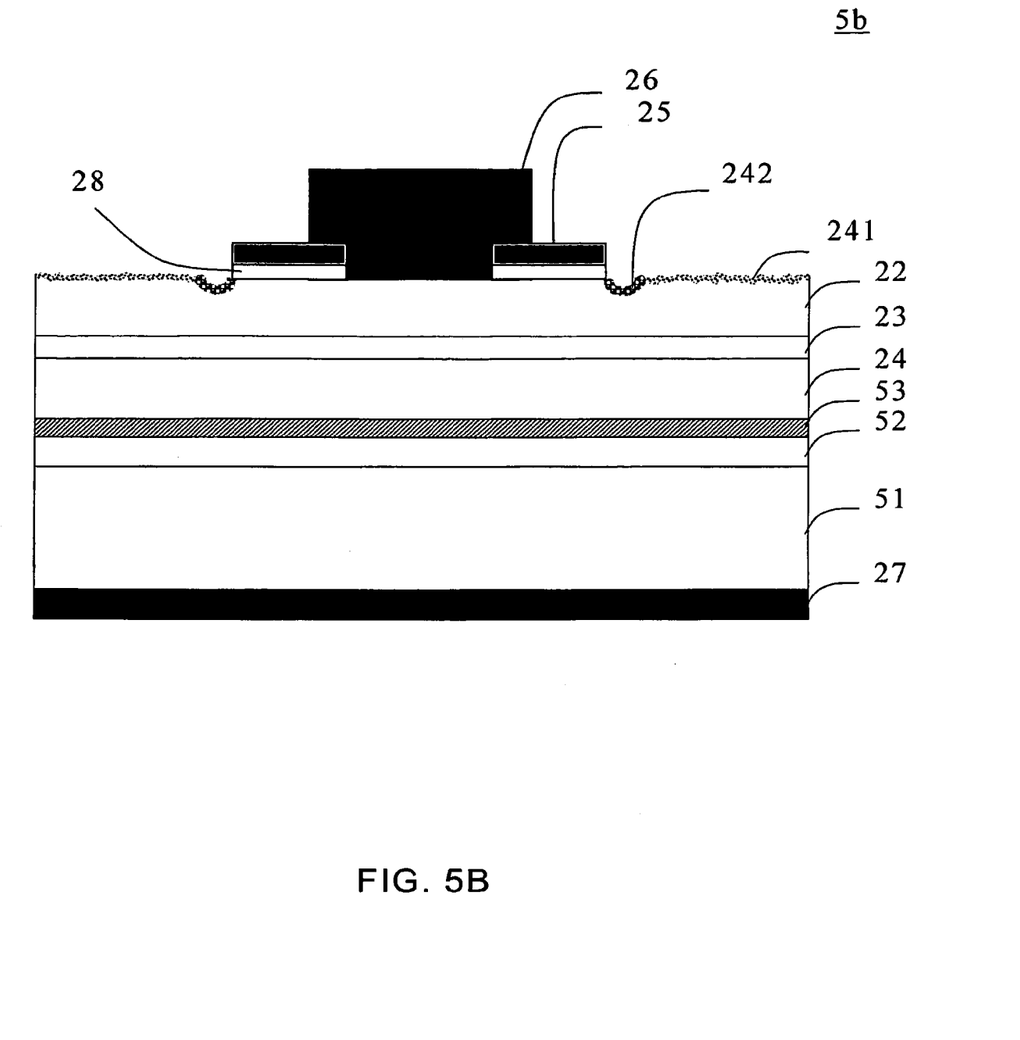

FIG. 5B shows another embodiment of the present invention. The light-emitting device 5b as shown in FIG. 5B is similar to the light-emitting device as mentioned above. The distinction is that the rough surface is formed on the first semiconductor layer 22.

The manufacturing method for forming the light-emitting device 5b comprises the steps of
1 providing a growth substrate (not shown);
2 forming a first semiconductor layer 22, an active layer 23, and a second semiconductor layer 24 sequentially on the growth substrate;
3 forming a reflecting layer 53 on the second semiconductor layer 24;
4 forming a conductive connecting layer 52 on a conductive substrate 51;
5 bonding the conductive substrate 51 with the conductive connecting layer 52 to the reflecting layer 53;
6 removing the growth substrate to expose one surface of the first semiconductor layer 22;
7 forming an extended electrode layer 25 on the exposed surface of the first semiconductor layer 22;
8 forming a first conductive pad 26 on a portion of the extended electrode layer 25 and the first semiconductor layer 22;
9 proceeding a thermal treatment step, such as rapid thermal annealing (RTA);
10 wet etching the first semiconductor layer 22 to form a rough surface thereon, wherein the features of the rough surface is described in the previous embodiments, such as FIG. 3A and FIG. 3B;
11 forming a second conductive pad 27 on the other side of the conductive substrate 51.

Figure 5C:
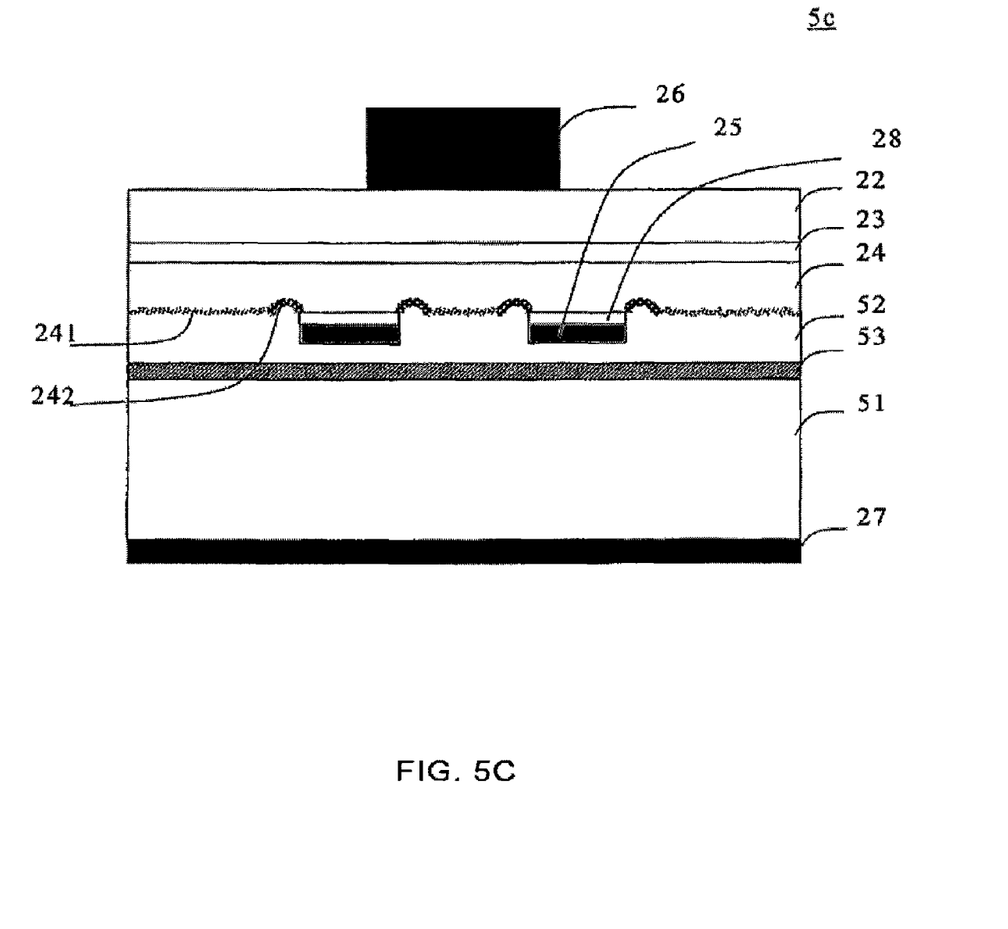

FIG. 5C shows another embodiment of the present invention. The distinction between the light-emitting device 5c as shown in FIG. 5C and the above-mentioned embodiment is that the rough surface is formed inside the light-emitting device 5c instead of on the outer surface of the light-emitting device.

The manufacturing method for forming the light-emitting device 5c comprises the steps of
1 providing a growth substrate (not shown);
2 forming a first semiconductor layer 22, an active layer 23, and a second semiconductor layer 24 sequentially on the growth substrate;
3 forming an extended electrode layer 25 on the second semiconductor layer 24;
4 proceeding a thermal treatment step, such as rapid thermal annealing (RTA);
5 wet etching the second semiconductor layer 24 to form a rough surface thereon, wherein the features of the rough surface is described in the previous embodiments, such as FIG. 3A and FIG. 3B;
6 forming a reflecting layer 53 on a conductive substrate 51;
7 forming a conductive connecting layer 52 on the reflecting layer 53;
8 bonding the extended electrode layer 25 and the second semiconductor layer 24 to the reflecting layer 53 by the conductive connecting layer 52;
9 removing the growth substrate to expose one surface of the first semiconductor layer 22;
10 forming a first conductive pad 26 on a portion of the exposed surface of the first semiconductor layer 22;
11 forming a second conductive pad 27 on the other side of the conductive substrate 51.

Figure 6:
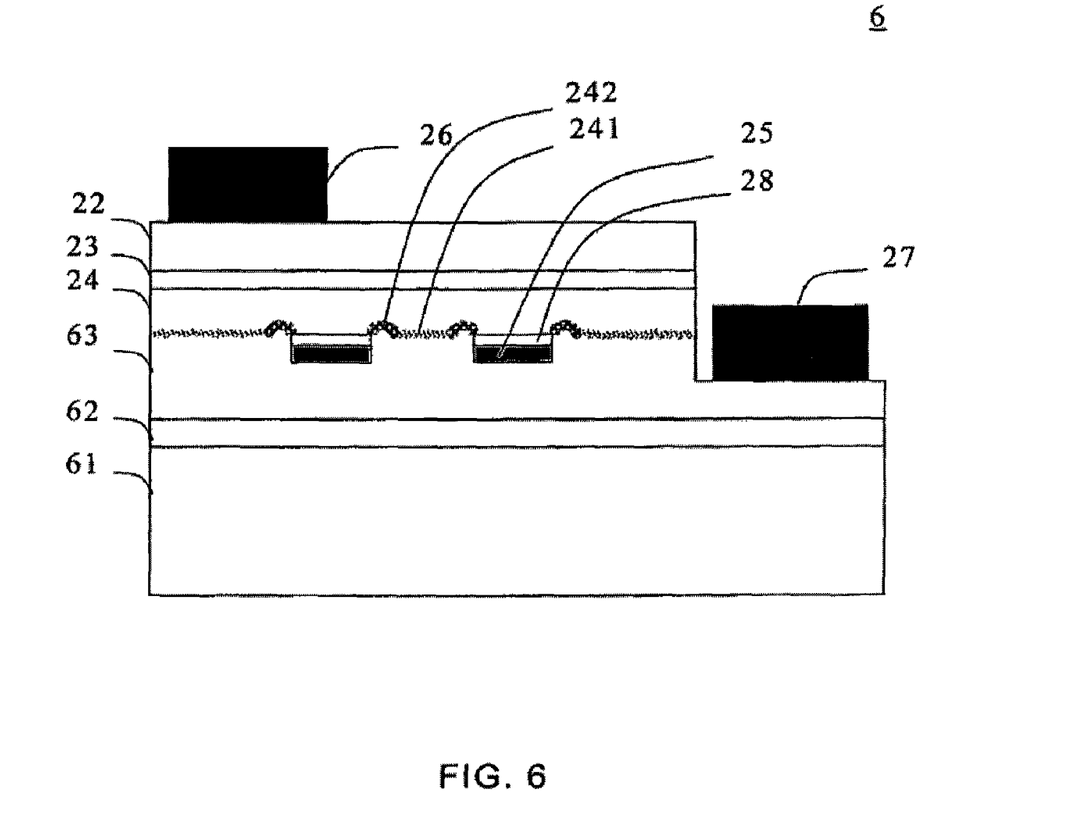
FIG. 6 is a schematic diagram showing a light-emitting device comprising a lateral structure in accordance with the present invention.

FIG. 6 shows a light-emitting device having a lateral structure as another embodiment of the present invention. The light-emitting device 6 and the light-emitting device 5c each comprises a rough surface inside the device. The distinction is that the light-emitting device 6 further comprises a transparent conductive layer 63 for electrically coupling the first conductive pad 26 to the second conductive pad 27 and bonding to a transparent substrate 61 by a transparent adhesive layer 62. At least one of the transparent adhesive layer 62 and the transparent substrate 61 comprises an insulating layer or an insulating structure for electrically isolating the transparent substrate 61 from the transparent conductive layer 63, such as forming an insulating layer on a transparent conductive substrate. The material of the transparent conductive layer 63 comprises indium tin oxide (ITO), zinc oxide (ZnO) or thin metal. The material of the transparent adhesive layer 62 comprises polyimide (PI), benzocyclobutene (BCB), perfluorocyclobutane (PFCB), epoxy resin, or silicone. The material of the transparent substrate 61 comprises sapphire, glass GaP, SiC, or CVD diamond. The light-emitting device 6 comprises a transparent bonding structure and a transparent substrate to be capable of extracting light from the substrate, and then improve the light extraction efficiency.

The manufacturing method for forming the light-emitting device 6 comprises the steps of:
1. providing a growth substrate (not shown);
2. forming a first semiconductor layer 22, an active layer 23, and second semiconductor layer 24 sequentially on the growth substrate;
3. forming an extended electrode layer 25 on the second semiconductor layer 24;
4. proceeding a thermal treatment step, such as rapid thermal annealing
(RTA);
5. wet etching the second semiconductor layer 24 to form a rough surface thereon, wherein the features of the rough surface is described in the previous embodiments, such as FIG. 3A and FIG. 3B;
6. forming a transparent conductive layer 63 the extended electrode layer 25 and the second semiconductor layer 24;
7. forming a transparent adhesive layer 62 on a transparent substrate 61;
8. bonding the transparent conductive layer 63 to the transparent substrate 61 by the transparent adhesive layer 62;
9. removing the growth substrate to expose one surface of the first semiconductor layer 22;
10. removing a part of the first semiconductor layer 22, the active layer 23, the second semiconductor layer 24, and the transparent conductive layer 63 to expose a portion of the transparent conductive layer 63;
11. forming a first conductive pad 26 on the first semiconductor layer 22;
12. forming a second conductive pad 27 on the exposed portion of the transparent conductive layer 63.

Another alternative embodiment for step 10 to step 12 of the method for forming the light-emitting device 6 is to remove a part of the first semiconductor layer 22, the active layer 23, the second semiconductor layer 24 to expose a portion of the second semiconductor layer 24, and form the second conductive pad 27 on the exposed portion of the second semiconductor layer 24.

According to the various embodiments described as above, it is still under the scope of the present invention to form the featured rough surface on both of the first semiconductor layer and the second semiconductor layer to further enhance the light extraction efficiency.

It should be noted that the proposed various embodiments are not for the purpose to limit the scope of the invention. Any possible modifications without departing from the spirit of the invention may be made and should be covered by the invention.

What is claimed is:

1. An optoelectronic semiconductor device comprising:
    a substrate;
    a semiconductor stack disposed on the substrate and having a rough surface;
    an electrode layer between the semiconductor stack and the substrate;
    a conductive connecting layer between the semiconductor stack and the substrate; and
    a first electrode structure overlaying the semiconductor stack; wherein the rough surface comprises a first region having a first rough topography and a second region having a second rough topography different from the first rough topography.

2. The optoelectronic semiconductor device according to claim 1, wherein the material of the conductive connecting layer comprises a silver paste or a solder metal.

3. The optoelectronic semiconductor device according to claim 1, wherein the material of the conductive connecting layer comprises a transparent conductive oxide.

4. The optoelectronic semiconductor device according to claim 1, wherein the material of the conductive connecting layer comprises a thin metal.

5. The optoelectronic semiconductor device according to claim 1, wherein a dimension of the second region is smaller than a dimension of the first region.

6. The optoelectronic semiconductor device according to claim 1, wherein the first region surrounds the first electrode structure.

7. The optoelectronic semiconductor device according to claim 1, wherein the first electrode structure comprises an electrode layer.

8. The optoelectronic semiconductor device according to claim 7, further comprising an ohmic contact layer formed between the semiconductor stack and the electrode layer.

9. The optoelectronic semiconductor device according to claim 7, wherein the first electrode structure further comprises a first conductive pad.

10. The optoelectronic semiconductor device according to claim 1, further comprising a second conductive pad on a surface of the substrate opposite to the semiconductor stack.

* * * * *